United States Patent
Kyung et al.

(10) Patent No.: US 7,925,965 B2
(45) Date of Patent: Apr. 12, 2011

(54) METHOD FOR TRANSMITTING/RECEIVING SIGNALS IN A COMMUNICATIONS SYSTEM AND AN APPARATUS THEREFOR

(75) Inventors: Gyu-Bum Kyung, Suwon-si (KR); Dong-Seek Park, Yongin-si (KR); Jae-Yoel Kim, Suwon-si (KR); Seung-Hoon Choi, Seoul (KR)

(73) Assignee: Samsung Electronics Co., Ltd (KR)

( * ) Notice: Subject to any disclaimer, the term of this patent is extended or adjusted under 35 U.S.C. 154(b) by 1105 days.

(21) Appl. No.: 11/702,005

(22) Filed: Feb. 2, 2007

(65) Prior Publication Data

US 2007/0220397 A1    Sep. 20, 2007

(30) Foreign Application Priority Data

Feb. 2, 2006  (KR) .................... 10-2006-0010260
Feb. 2, 2007  (KR) .................... 10-2007-0010819

(51) Int. Cl.
*G06F 11/00*  (2006.01)

(52) U.S. Cl. ........................................ 714/801
(58) Field of Classification Search ............... 714/752, 714/800–801
See application file for complete search history.

(56) References Cited

U.S. PATENT DOCUMENTS

| 6,895,547 B2* | 5/2005 | Eleftheriou et al. ........ 714/801 |
| 2006/0190801 A1* | 8/2006 | Shin et al. .................... 714/758 |

FOREIGN PATENT DOCUMENTS

| KR | 102005011959 | 12/2005 |
| KR | 1020060093627 | 8/2006 |

\* cited by examiner

*Primary Examiner* — Shelly A Chase
(74) *Attorney, Agent, or Firm* — The Farrell Law Firm, P.C.

(57) ABSTRACT

A method for transmitting a signal in a signal transmission apparatus of a communications system including receiving an information vector, and encoding the information vector according to a zigzag B-LDPC encoding scheme to generate a zigzag B-LDPC codeword, thereby advantageously reducing the encoding complexity together with enhanced error correction capability.

34 Claims, 7 Drawing Sheets

METHOD FOR TRANSMITTING/RECEIVING SIGNALS IN A COMMUNICATIONS SYSTEM AND AN APPARATUS THEREFOR

PRIORITY

This application claims priority under 35 U.S.C. §119 to an application filed in the Korean Intellectual Property Office on Feb. 2, 2006 and assigned Serial No. 2006-10260, and an application filed in the Korean Intellectual Property Office on Feb. 2, 2007 and assigned Serial No. 2007-10819, the contents of both of which are incorporated herein by reference.

BACKGROUND OF THE INVENTION

1. Field of the Invention

The present invention relates to a method and apparatus for transmitting/receiving a signal in a communications system, and in particular to a method for transmitting/receiving a signal by an LDPC (Low Density Parity Check) code.

2. Description of the Related Art

The next generation communications system has been developed as a packet service communications system, which is a high capacity transmission system, to transmit burst packet data to a plurality of mobile stations. As the channel code effectively used for the next generation communications system, the LDPC code, along with the turbo code, has been positively considered for its good performance gain in high speed data transmission and improved reliability attained through effective correction of noise-related errors. Examples of the next generation communications system are the IEEE (Institute of Electrical and Electronic Engineers) 802.16e and 802.11n communications systems.

Referring to FIG. 1, there is described the structure of the signal transmission apparatus of a conventional communications system using the LDPC code. The signal transmission apparatus consists of an encoder 111, a modulator 113, and a transmitter 115. The information vector s to be transmitted is encoded by the encoder 111, according to a prescribed encoding method, into a codeword vector c, i.e., LDPC codeword, delivered to the modulator 113. In this case, the prescribed encoding method is the LDPC encoding. The modulator 113 modulates the codeword vector c, according to a prescribed modulation method into the modulated vector m delivered to the transmitter 115. The transmitter 115 processes the modulated vector m to generate the transmission signal transmitted to the signal receiving apparatus.

Referring to FIG. 2, there is described the structure of the signal receiving apparatus of a conventional communications system using the LDPC code. The signal receiving apparatus consists of a receiver 211, a demodulator 213, and a decoder 215. The receiver 211 processes the transmission signal received through the antenna to generate the receiving vector r delivered to the demodulator 213, which demodulates it, according to the demodulation method matching the modulation method of the modulator 113, into the demodulated vector x delivered to the decoder 215. The decoder 215 decodes the demodulated vector x according to the decoding method matching the encoding method of the encoder 111 so as to finally generate the recovered information vector ŝ.

As described above, the LDPC code has advantages, as in the turbo code, that the performance gain is superior at high speed data transmission and the reliability of the data transmission is improved by effective correction of the noise-related errors. The cycle of the LDPC code on the factor graph means the loop consisting of the edge connecting the variable node and the check node on the factor graph of the LDPC code, and the size of the cycle is defined as the number of edges. Accordingly, the size of the cycle increases with the number of the edges connecting the variable node and the check node. Thus, the performance of the LDPC code is improved as the cycle size of the LDPC code is increased on the factor graph.

Conversely, as the number of small-sized cycles of the LDPC is increased on the factor graph, the LDPC code suffers performance degradation due to error floor phenomena, impairing the error correction capability. Hence, if there are many small-sized cycles of the LDPC code on the factor graph, the information starting from an arbitrary node belonging to a small-sized cycle returns to itself after a small number of repetition, and thus, the increase of the repetition number results in the increase of the information returns, so that the information update is hindered so as to impair the error correction capability.

Moreover, the LDPC code is more complicated in encoding than the turbo code, making it difficult to encode in real time. In order to reduce the encoding complexity of the LDPC code, a repeated accumulation (RA) has been proposed, but the RA code also suffers limitations in reducing the encoding complexity of the LDPC code.

Therefore, when transmitting/receiving signals using LDPC code in a communications system, a solution is demanded to reduce the encoding complexity of the LDPC code together with enhanced error correction capability.

SUMMARY OF THE INVENTION

Accordingly, an aspect of the present invention is to provide a method and apparatus for transmitting/receiving signals by using a zigzag LDPC code in a communications system.

Another aspect of the present invention is to provide a method and apparatus for transmitting/receiving signals by using a zigzag LDPC code in a communications system, which reduces the encoding complexity.

Another aspect of the present invention is to provide a method and apparatus for transmitting/receiving signals by using a zigzag LDPC code in a communications system, which enhances the error correction capability.

According to one aspect of the present invention, a method for transmitting a signal in a signal transmission apparatus of a communications system includes receiving an information vector and encoding the information vector according to a zigzag B-LDPC encoding procedure to generate a zigzag B-LDPC codeword, thereby reducing the encoding complexity together with enhanced error correction capability.

BRIEF DESCRIPTION OF THE DRAWINGS

The above and other aspects, features and advantages of the present invention will become more apparent from the following detailed description when taken in conjunction with the accompanying drawing in which.

DETAILED DESCRIPTION OF THE PREFERRED EMBODIMENT

Preferred embodiments of the present invention will be described herein below with reference to the accompanying drawings. In the following description, well-known functions or constructions are not described in detail since they would obscure the invention in unnecessary detail.

The present invention provides a method and apparatus for transmitting/receiving signals by means of the zigzag B-LDPC (Block Low Density Parity Check) code in a communications system. This method provides reduction of the encoding complexity together with enhanced error correction. Moreover, the method of transmitting/receiving signals by means of the zigzag B-LDPC code of the invention may be applied to the signal transmission/receiving apparatus of a conventional communications system.

The zigzag B-LDPC code is achieved by designing a Concatenated ZigZag (CZZ) using a structured interleaver so as to enable the CZZ code parity check matrix to have a structured LDPC matrix. Hence, the zigzag B-LDPC code represents the CZZ code having a parity check matrix in the form of the structured LDPC code matrix.

Figure 3:
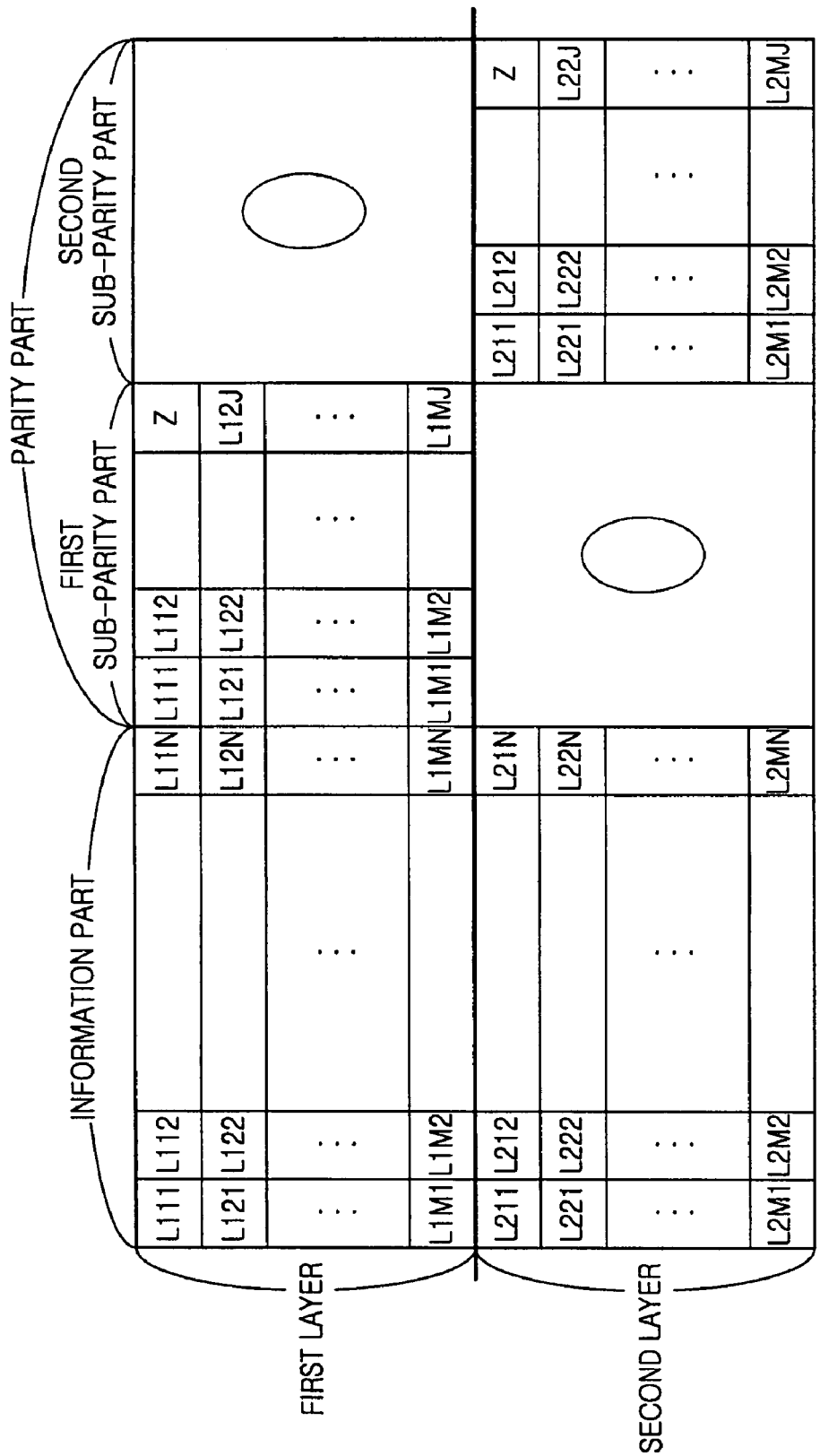
FIG. 3 is a schematic diagram for showing the zigzag B-LDPC code matrix according to the present invention.

Referring to FIG. 3, there is described the zigzag B-LDPC matrix. The zigzag B-LDPC code matrix consists of L structured concatenated zigzag codes. Specifically, the zigzag B-LDPC code matrix shown in FIG. 3 represents the case of L=2, having two structured concatenated zigzag codes. Generally, L is an integer representing 1 or more.

The structured zigzag code has a parity check matrix consisting of a partial matrix of a permutation matrix. The permutation matrix is a square matrix with a size of $N_s \times N_s$, of which each row has a weight of 1, and each column also a weight of 1. In this case, the term 'weight' represents the number of elements having a non-zero value, and for convenience, it is assumed the non-zero value equals 1. Here, the zigzag B-LDPC code matrix consisting of two layers #1 and #2, respectively, representing a first and a second structured zigzag code. Thus, the zigzag B-LDPC matrix consists of two layers formed by their respective structured zigzag codes.

More specifically, the parity check matrix of the zigzag B-LDPC code consists of a plurality of blocks representing respective matrixes. Hereinafter, the matrix corresponding to each block is called "block matrix," which is a square matrix with a size of $N_s \times N_s$, as described above. Hence, the block size is $N_s$. In addition, the parity check matrix of the B-LDPC code consists of an information part corresponding to the information bits contained in the information vector (s) and a parity part corresponding to parity bits. The parity part includes two sub-parity parts belong to their respective structured zigzag codes. Namely, the structured zigzag code also includes an information part and a parity part, which is the sub-parity part.

Furthermore, in FIG. 3, the information part belonging to the first layer consists of M×N blocks, the information part belonging to the second layer consists of M×N blocks, a first sub-parity part belonging to the first layer consists of M×J blocks, a first sub-parity part belonging to the second layer consists of M×J blocks, a second sub-parity part belonging to the first layer consists of M×J blocks, and a second sub-parity part belonging to the second layer consists of M×J blocks.

First, each of the block columns constituting the information part of the parity check matrix of the zigzag B-LDPC code has a weight of 1. The fact that each block column has a weight of 1 means that the permutation matrix is attached to only one of the blocks constituting each block column, and 0 (zero) matrix to the other blocks. For example, in FIG. 3, only one of the plural block matrixes L111, L121, . . . , L1M1 constituting the first block column of the first layer is a permutation matrix, and the other block matrixes are 0.

Second, the block matrix at a particular position of the first and the second sub-parity part of the parity check matrix of the zigzag B-LDP code, (e.g., the block matrix corresponding to the one at the uppermost and rightmost position of the plural blocks contained in the first sub-parity part of the first layer and the block matrix corresponding to the one at the uppermost and rightmost position of the plural blocks contained in the second sub-parity part of the second layer) is set as the Z matrix as expressed by the following mathematical Formula 1:

$$Z = \begin{pmatrix} 0 & 0 & 0 & \ldots & 0 \\ 1 & 0 & 0 & \ldots & 0 \\ 0 & 1 & 0 & \ldots & 0 \\ & & \vdots & & \\ 0 & \ldots & 0 & 1 & 0 \end{pmatrix} \quad \text{Formula 1}$$

The Z matrix as shown by Formula 1 is obtained by shifting the identity matrix toward the left by one column so as to make all elements of the rightmost column have a value of zero. Thus, if the Z matrix is attached to the block matrix corresponding to the one at the uppermost and rightmost position of the plural blocks contained in the first sub-parity part of the first layer and the block matrix corresponding to the one at the uppermost and rightmost position of the plural blocks contained in the second sub-parity part of the second layer, the number of the block columns produced with a weight of 1 is prevented from becoming $N_s$. The reason for preventing the number of the block columns with a weight of 1 from becoming $N_s$ is that as the number of columns with a weight of 1 increases in the parity check matrix of the LDPC code, the LDPC performance characteristics are considerably degraded.

Third, the parity part of the parity check matrix of the zigzag B-LDPC code has a weight of non-zero only both in the first sub-parity part of the first layer and in the second sub-parity part of the second layer, and the other sub-parity parts have a weight of zero. Namely, as shown in FIG. 3, the non-zero matrix appears only both in the first sub-parity part of the first layer and in the second sub-parity part of the second layer, and therefore, the drawing indicates the second sub-parity part of the first layer and the first sub-parity part of the second layer with "0."

Fourth, each of the block matrixes, L111, L122, L133, . . . , L1MM constituting a diagonal of the first sub-parity part of the first layer among the parity part of the parity check matrix of the zigzag B-LDPC code is a permutation matrix, and each of the block matrixes, L121, L132, L143, . . . , L1MM-1 constituting just below parallel to the diagonal is an identity matrix. Hereinafter, the diagonal and the portion below parallel to the diagonal are referred to as 'dual diagonal'. The other matrices except for the block matrices in the dual diagonal and Z at the uppermost and rightmost position of the first sub-parity part of the first layer are 0 matrixes. Further, the dual diagonal of the second sub-parity part of the second layer, L211, L222, L233, . . . , L2MM and L221, L232, L243, . . . , L2MM-1 are identity matrixes, and the other matrices except for the block matrices in the dual diagonal and Z at the uppermost and rightmost position of the second sub-parity part of the second layer are 0 matrices.

The characteristics of the parity check matrix of the zigzag B-LDPC may be applied to L concatenated structured zigzag codes as follows:

First, each of the block columns constituting the information part of the parity check matrix of the zigzag B-LDPC code has a weight of 1.

Second, the Z matrix is attached to a particular position of the first, the second, . . . , and the L'th sub-parity part of the parity check matrix of the zigzag B-LDPC code, e.g., the block matrix corresponding to the one at the uppermost and rightmost position of the blocks in the first sub-parity part of the first layer, the block matrix corresponding to the one at the uppermost and rightmost position of the blocks in the second sub-parity part of the second layer, . . . , the block matrix corresponding to the one at the uppermost and rightmost position of the blocks in the L'th sub-parity part of the L'th layer.

Third, the parity part of the parity check matrix of the zigzag B-LDPC code has a weight of non-zero only both in the first sub-parity part of the first layer and in the second sub-parity part of the second layer, . . . , and in the L'th sub-parity part of the L'th layer, and the other sub-parity parts have a weight of zero.

Fourth, the dual diagonal of the first sub-parity part of the first layer of the parity check code matrix of the zigzag B-LDPC is constituted as the identity matrixes, the other matrices except for the block matrices in dual diagonal and Z at the uppermost and rightmost position of the first sub-parity part of the first layer are 0 matrices. The dual diagonal of the second sub-parity part of the second layer is constituted as the identity matrixes, the other matrices except for the block matrices in the dual diagonal and Z at the uppermost and rightmost position of the second sub-parity part of the second layer are 0 matrices, and the dual diagonal of the Lth sub-parity part of the Lth layer is constituted as the identity matrices, the other matrices except for the block matrices in dual diagonal and Z at the uppermost and rightmost position of the Lth sub-parity part of the Lth layer are 0 matrices.

Figure 4:
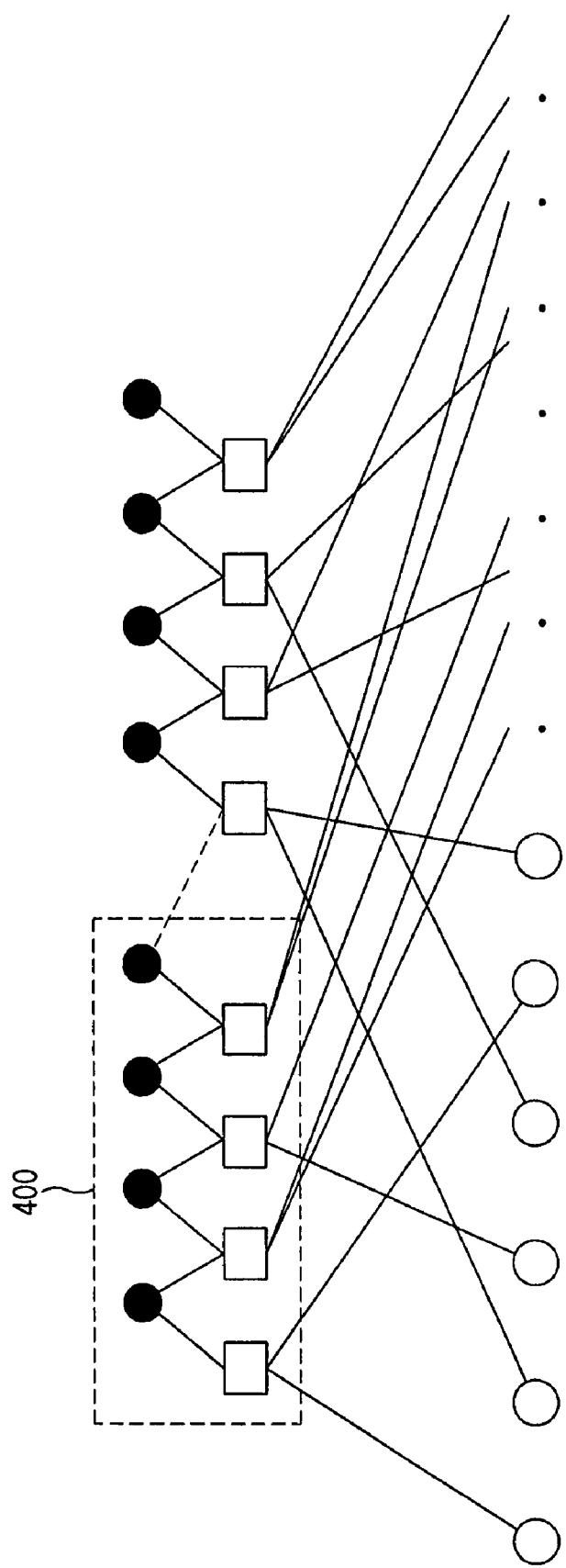
FIG. 4 is a factor graph corresponding to a zigzag B-LDPC code matrix of FIG. 3.

In FIG. 4, there is described the factor graph corresponding to the parity check matrix of the zigzag B-LDPC code as shown in FIG. 3. In the drawing, the factor graph shows a structure of the parity part 400 indicated by dotted lines, the parity parts 400 being repeated by $N_S$ times. The Z matrix, as shown by Formula 1 connects the $N_S$ repeated parity parts so as to eliminate the parity variable node with a weight of 1, making it possible to encode through an accumulator.

Figure 5:
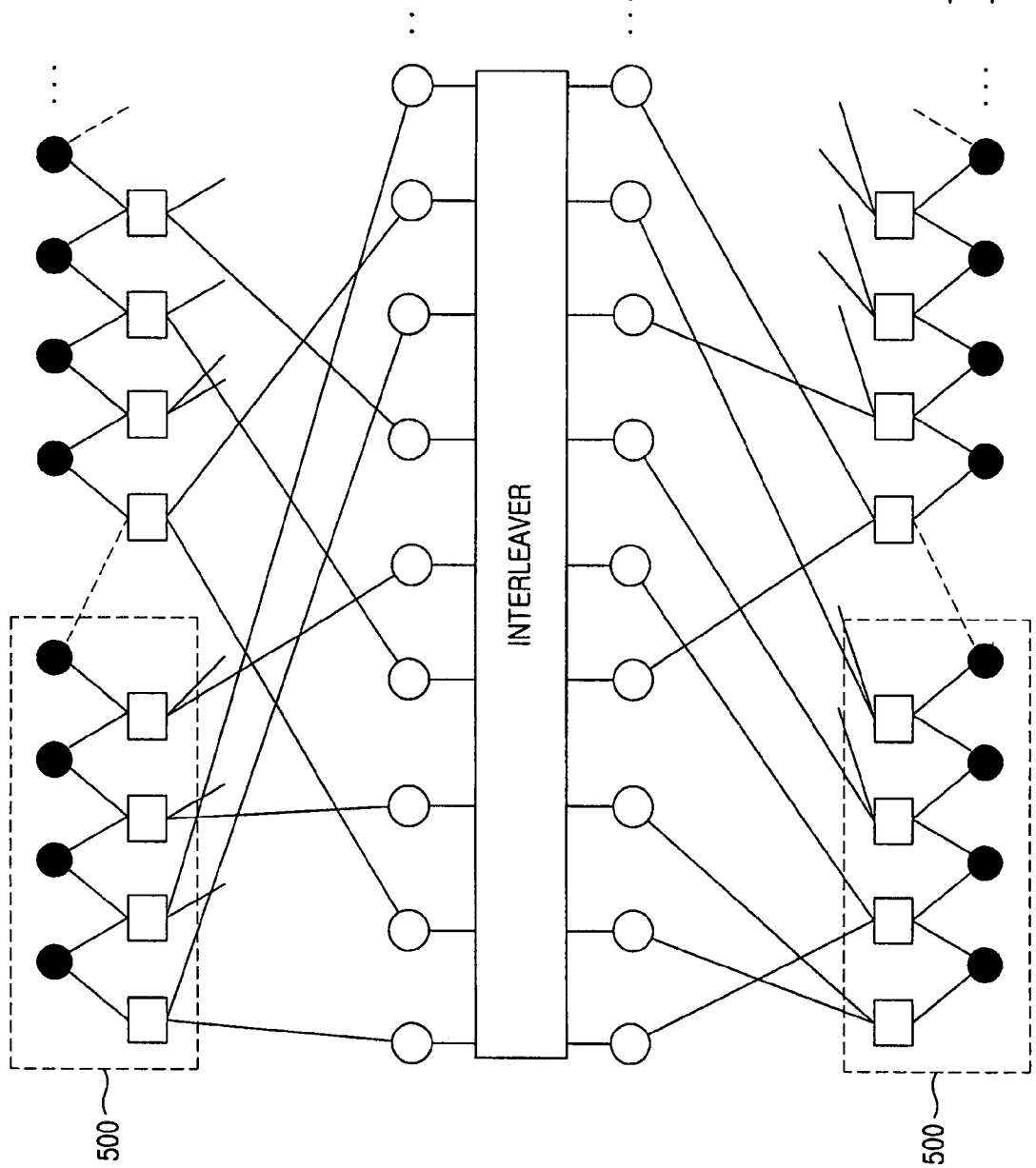
FIG. 5 is a factor graph corresponding to the zigzag B-LDPC code matrix of FIG. 3 if L equals 2.

In FIG. 5, for L=2, there is described a factor graph corresponding to the parity check matrix of the zigzag B-LDPC code as shown in FIG. 3. If L=2, the factor graph shows a structure of two structured zigzag codes connected with an interleaver between them. This factor graph also shows a structure of the parity part 500 indicated by dotted lines, with the parity parts being repeated by $N_S$ times. In this case also, the Z matrix, as shown by Formula 1, connects the $N_S$ repeated parity parts so as to eliminate the parity variable node with a weight of 1, making it possible to encode through an accumulator.

Figure 1:
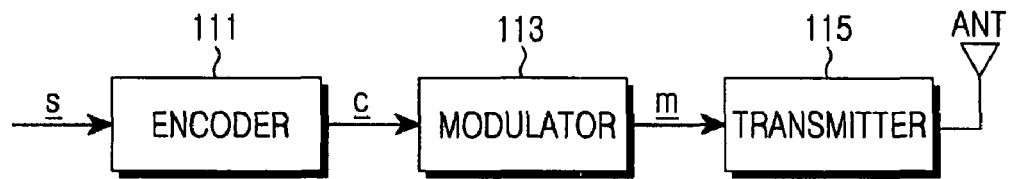
FIG. 1 is a schematic diagram for illustrating the structure of a signal transmission apparatus provided in a conventional communications system using the LDPC code.
Figure 6:
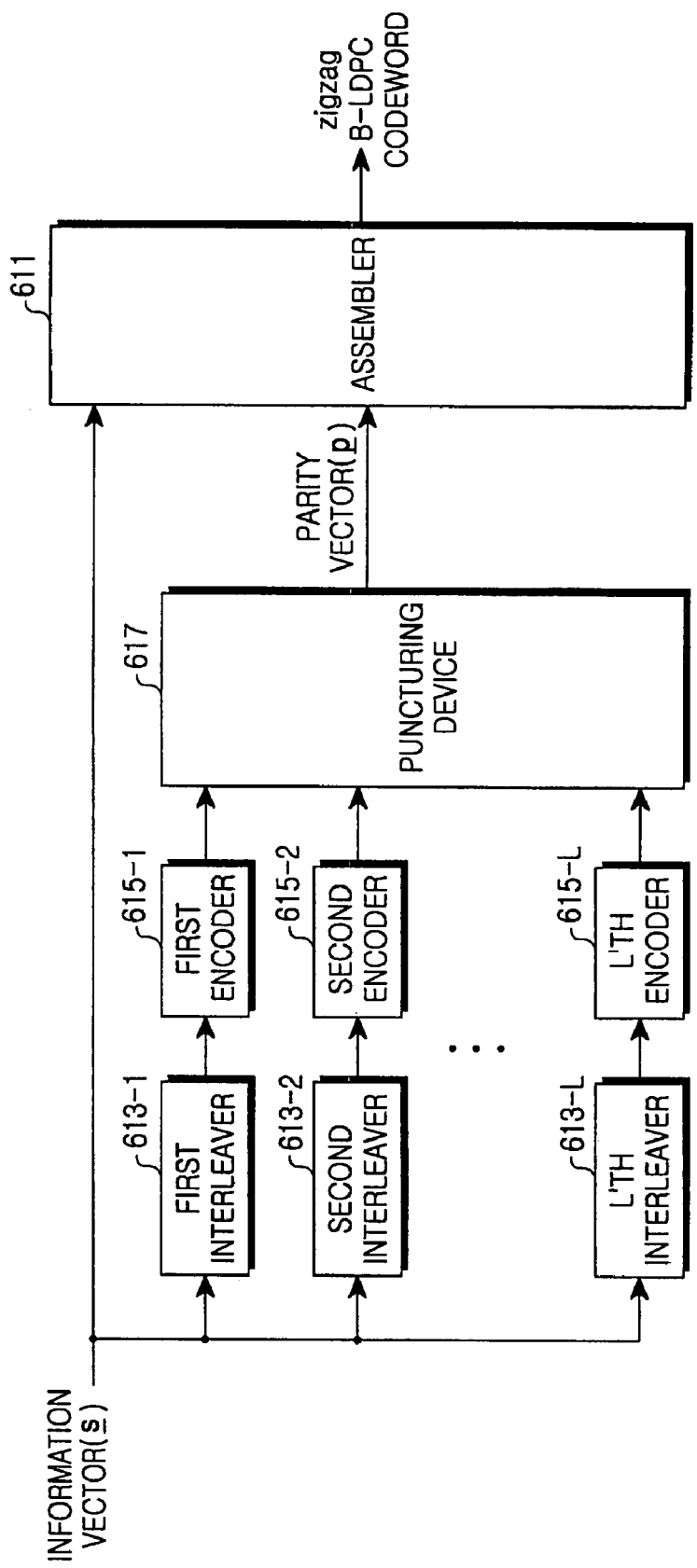
FIG. 6 is a schematic diagram for illustrating the internal structure of an encoder according to the present invention.

In FIG. 6, there is described the internal structure of the encoder according to the present invention. The encoder part corresponds with the encoder 111 as shown in FIG. 1, except for the encoding procedure for encoding the zigzag B-LDPC code according to the present invention. In particular, the encoder part encodes the zigzag B-LDPC code according to the inventive encoding procedure, which matches the parity check matrix of the zigzag B-LDPC code.

As shown in FIG. 6, the encoder part comprises an assembler 611, a plurality of interleavers 613-1 to 613-L, a plurality of encoders 615-1 to 615-L, and a puncturing device 617. The zigzag B-LDPC code according to the present invention is achieved by setting component codes to a plurality of structured zigzag codes connected by the interleavers.

In operation, the information vector s to be transmitted by the signal transmission apparatus is applied to the assembler 611 and the first to L'th interleavers 613-1 to 613-L. The first to L'th interleavers 613-1 to 613-L interleave the information vector s according to their respectively prescribed interleaving procedures, delivered respectively to the first to L'th encoders 615-1 to 615-L, which usually consist of the accumulators to generate structured zigzag codes. Specifically, the first to L'th encoders 615-1 to 615-L perform an operation similar to the operation performed by accumulator used for generating repeated accumulation (RA) code, continuously accumulating the inputted values to generate the parity bits. Assuming the number of the information bits connected to a single parity bit of the structured zigzag code to be k, the first to L'th encoders 615-1 to 615-L encoders accumulate k information bits to generate one bit as the parity bit delivered to the puncturing device 617. Further, the first to L'th encoders 615-1 to 615-L generate a single parity bit consisting of the accumulated k information bits, delivered to the puncturing device 617. Hence, this is the same operation as generating the convolutional code with a punctured memory value of 1, and the generation is achieved by the following Formula 2:

$$\left[1 \frac{1}{1+D}\right] \qquad \text{Formula 2}$$

Formula 2 represents a conventional accumulator outputting the convolutional codes, which are punctured to generate k bits as a unit.

The puncturing device 617 punctures the structured zigzag codes outputted at the coding rate used for the signal transmission apparatus from the first to L'th encoders 615-1 to 615-L, according to a prescribed puncturing pattern, to generate the parity vector delivered to the assembler 611. The operation of the puncturing device 617 has no direct connection with the invention, and is omitted from detailed description. The assembler 611 assembles the information vector (s) and the parity vector p to generate the zigzag B-LDPC codeword.

Figure 7:
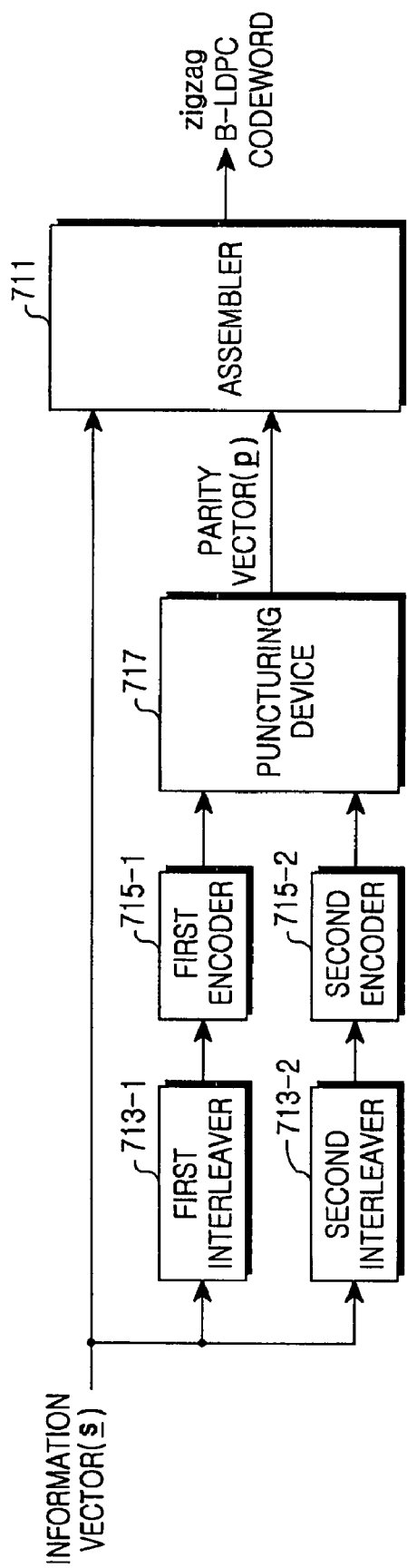
FIG. 7 is a schematic diagram for illustrating the internal structure of an encoder according to the present invention if L equals 2.

In FIG. 7, there is described the internal structure of the encoding part with L=2 according to the present invention. The encoding part includes an assembler 711, first and second interleavers 713-1 and 713-2, first and second encoders 715-1 and 715-2, and a puncturing device 717. The encoders shown in FIG. 7 perform the same operation as in FIG. 6, except the structure is limited to L=2.

Figure 2:
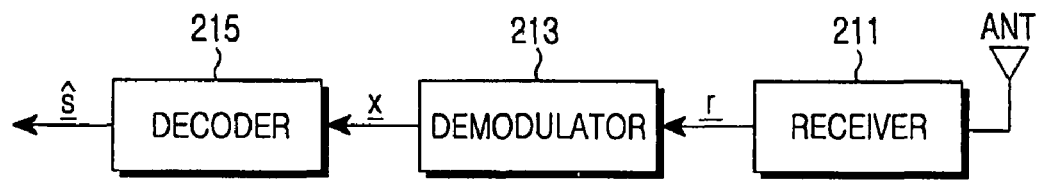
FIG. 2 is a schematic diagram for illustrating the structure of a signal receiving apparatus provided in a conventional communications system using the LDPC code.
Figure 8:
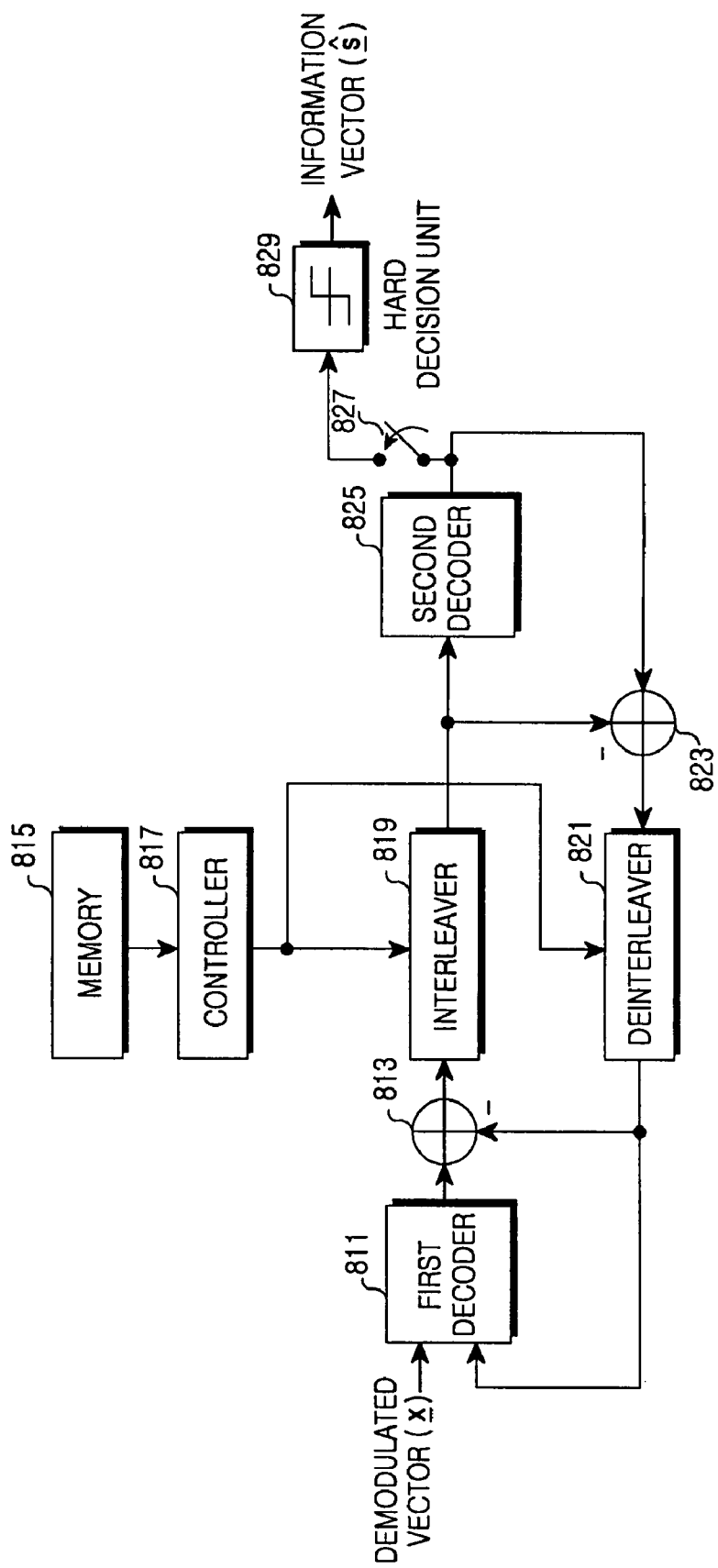
FIG. 8 is a schematic diagram for illustrating the internal structure of a decoder according to the present invention.

In FIG. 8, there is described the internal structure of the decoding part. The decoding part shown corresponds with the decoder 215 as shown in FIG. 2, except the decoding procedure for decoding the zigzag B-LDPC code is according to the present invention. Similarly, the decoding part of FIG. 8 has the structure with L=2 accommodated with the encoding part of FIG. 7. The decoding part includes a first decoder 811, a first subtracter 813, a memory 815, a controller 817, an interleaver 819, a deinterleaver 821, a second subtracter 823, a second decoder 825, a switch 827, and a hard decision unit 829.

In operation, the demodulated vector (x) and the output signal of the deinterleaver 821 are applied to the first decoder 811. Here, the output signal of the deinterleaver 821 is the updated information in the previous decoding. When there is no updated information in the initial decoding, the demodulated vector (x) is only applied to the first decoder 811.

The first decoder 811 decodes the demodulated vector (x) and the output signal of the de-interleaver 821, according to a prescribed decoding procedure, to generate the decoded signal delivered to the first subtracter 813. In this case, the decoding procedure corresponds with the encoding procedure used in the first encoder 715-1 of FIG. 7, namely, the encoding procedure for encoding the structured zigzag code. The first subtracter 813 subtracts the output signal of the deinterleaver 821 from the output signal of the first decoder 811 to generate the difference to the interleaver 819. When the decoding procedure is initially made, and there is no updated information, the first subtracter 813 transfers only the output signal of the first decoder 811 to the interleaver 819.

The controller 817 retrieves the interleaving and deinterleaving patterns from the memory 815, respectively delivered to the interleaver 819 and the deinterleaver 821 to perform interleaving and deinterleaving according to the patterns. The interleaving and deinterleaving patterns are generated corresponding with the parity check matrix of the zigzag B-LDPC code.

The interleaver 819 interleaves the output signal of the subtracter 813 according to the interleaving pattern to generate the interleaved signal to the second decoder 825 and the second subtracter 823. The second decoder 825 decodes the output signal of the interleaver 819 according to the prescribed decoding procedure to deliver the decoded signal to the switch 827. Here, the decoding procedure corresponds with the encoding procedure used in the second encoder 715-2 of FIG. 7, namely, the encoding procedure for encoding the structured zigzag code.

After completing a predetermined repetition of the decoding operation, the switch 827 is turned on to deliver the output signal of the second decoder 825 to the hard decision unit 829. In this case, the switch may be turned on when completing either a predetermined repetition of the decoding operation or every single decoding operation. When the switch is turned on at every single decoding operation, the parity check may be performed to be used as the reference for ending the repeated decoding operation. Thus, the invention advantageously provides a method of transmitting and receiving signals in a communications system, which employs the zigzag B-LDPC code that the parity check matrix is the CZZ code having the same form as the structured LDPC code, thereby considerably reducing the encoding complexity together with enhanced error correction capability.

While the invention has been shown and described with reference to a certain preferred embodiment thereof, it will be understood by those skilled in the art that various changes in form and details may be made therein without departing from the spirit and scope of the invention.

What is claimed is:

1. A method for transmitting a signal in a signal transmission apparatus of a communications system, comprising the steps of:
   receiving an information vector; and
   generating a zigzag B-LDPC (Block Low Density Parity Check) codeword by encoding the information vector according to a zigzag B-LDPC encoding scheme.

2. A method as defined in claim 1, further including transmitting the zigzag B-LDPC codeword.

3. A method as defined in claim 1, wherein the zigzag B-LDPC encoding scheme is a scheme encoding the information vector corresponding to a parity check matrix including an information part corresponding to information bits and a parity part corresponding to parity bits, each of the information part and parity part including a plurality of blocks each corresponding to a block matrix.

4. A method as defined in claim 3, wherein the weight of each of the block rows constituting the information part is 1.

5. A method as defined in claim 3, wherein the parity part comprises L sub-parity parts each having the same number of blocks, and the block matrix corresponding to a particular block belonging to each of the sub-parity parts is a matrix Z obtained by shifting an identity matrix toward the left by one column so as to make all elements of the rightmost column have the value of zero, the matrix Z being expressed by the following mathematical Formula:

$$Z = \begin{pmatrix} 0 & 0 & 0 & \ldots & 0 \\ 1 & 0 & 0 & \ldots & 0 \\ 0 & 1 & 0 & \ldots & 0 \\ & & \vdots & & \\ 0 & \ldots & 0 & 1 & 0 \end{pmatrix}.$$

6. A method as defined in claim 5, wherein if each of the L sub-parity parts includes L layers, and each of the L layers includes the same number of blocks, the particular block for each of the L sub-parity parts is an uppermost and rightmost one of the blocks included in an arbitrary one of the L layers.

7. A method as defined in claim 5, wherein the weight of the layer containing the particular block only is not zero for each of the L sub-parity parts.

8. A method as defined in claim 1, wherein the step of encoding the information vector to generate the zigzag B-LDPC codeword further comprises:
   interleaving the information vector so as to correspond with a first and a second interleaving pattern to generate a first and a second signal;
   encoding the first signal by a structured zigzag encoding scheme to generate a first structured zigzag codeword;
   encoding the second signal by the structured zigzag encoding scheme to generate a second structured zigzag codeword;
   puncturing the first and second structured zigzag codewords according to a puncturing pattern corresponding to the encoding rate proper for the signal transmission apparatus to generate a parity part; and
   generating the information vector as an information part assembled with the parity part so as to produce the zigzag B-LDPC codeword.

9. A signal transmission apparatus provided in a communications system, comprising: an encoder for generating a zigzag B-LDPC (Block Low Density Parity Check) codeword by encoding an information vector received according to a zigzag B-LDPC encoding scheme.

10. A signal transmission apparatus as defined in claim 9, further including a transmitter for transmitting the zigzag B-LDPC codeword.

11. A signal transmission apparatus as defined in claim 9, wherein the zigzag B-LDPC encoding scheme is a scheme encoding the information vector corresponding to a parity check matrix including an information part corresponding to information bits and a parity part corresponding to parity bits, each of the information part and the parity part including a plurality of blocks each corresponding to a block matrix.

12. A signal transmission apparatus as defined in claim 11, wherein the weight of each of a block row constituting the information part is 1.

13. A signal transmission apparatus as defined in claim 11, wherein the parity part comprises L sub-parity parts, each having the same number of blocks, and the block matrix corresponding to a particular block belonging to each of the sub-parity parts is a matrix Z obtained by shifting an identity matrix toward the left by one column so as to make all elements of the rightmost column have the value of zero, the matrix Z being expressed by the following mathematical Formula:

$$Z = \begin{pmatrix} 0 & 0 & 0 & \ldots & 0 \\ 1 & 0 & 0 & \ldots & 0 \\ 0 & 1 & 0 & \ldots & 0 \\ & & \vdots & & \\ 0 & \ldots & 0 & 1 & 0 \end{pmatrix}.$$

14. A signal transmission apparatus as defined in claim 13, wherein if each of the L sub-parity parts includes L layers, and each of the L layers includes the same number of blocks, the particular block for each of the L sub-parity parts being a uppermost and rightmost one of the blocks included in an arbitrary one of the L layers.

15. A signal transmission apparatus as defined in claim 14, wherein the weight of the layer containing the particular block only is not zero for each of the L sub-parity parts.

16. A signal transmission apparatus as defined in claim 9, wherein said the encoder comprises:
 a first interleaver for interleaving the information vector so as to correspond with a first interleaving pattern to generate a first signal;
 a second interleaver for interleaving the information vector so as to correspond with a second interleaving pattern to generate a second signal;
 a first encoder for encoding the first signal by a structured zigzag encoding scheme to generate a first structured zigzag codeword;
 a second encoder for encoding the second signal by the structured zigzag encoding scheme to generate a second structured zigzag codeword;
 a puncturing device for puncturing the first and second structured zigzag codewords according to a puncturing pattern corresponding to the encoding rate proper for the signal transmission apparatus to generate a parity part; and
 an assembler for generating the information vector as an information part assembled with the parity part so as to produce the zigzag B-LDPC codeword.

17. A method for receiving a signal in a signal receiving apparatus provided of a communications system, comprising the step of:
 decoding a received signal according to a decoding scheme matching a zigzag B-LDPC (Block Low Density Parity Check) encoding scheme to generate an information vector.

18. A method as defined in claim 17, wherein the zigzag B-LDPC encoding scheme encodes the information vector corresponding to a parity check matrix including an information part corresponding to information bits and a parity part corresponding to parity bits, each of the information part and the parity part including a plurality of blocks each corresponding to a block matrix.

19. A method as defined in claim 18, wherein the weight of each of the block rows constituting the information part is 1.

20. A method as defined in claim 18, wherein the parity part comprises L sub-parity parts each having the same number of blocks, and the block matrix corresponding to a particular block belonging to each of the sub-parity parts is a matrix Z obtained by shifting an identity matrix toward the left by one column so as to make all elements of the rightmost column have the value of zero, the matrix Z being expressed by the following mathematical Formula:

$$Z = \begin{pmatrix} 0 & 0 & 0 & \ldots & 0 \\ 1 & 0 & 0 & \ldots & 0 \\ 0 & 1 & 0 & \ldots & 0 \\ & & \vdots & & \\ 0 & \ldots & 0 & 1 & 0 \end{pmatrix}.$$

21. A method as defined in claim 20, wherein if each of the L sub-parity parts includes L layers, and each of the L layers includes the same number of blocks, the particular block for each of the L sub-parity parts is an uppermost and rightmost one of the blocks included in an arbitrary one of the L layers.

22. A method as defined in claim 20, wherein the weight of the layer containing the particular block only is not zero for each of the L sub-parity parts.

23. A method as defined in claim 17, wherein the step of generating an information vector comprises the steps of:
 decoding the received signal and updated information in a previous decoding according to the decoding scheme matching the zigzag encoding scheme to generate a first signal;
 interleaving the remaining signal after subtracting the updated information from the first signal to generate a second signal;
 decoding the second signal according to the decoding scheme matching the zigzag encoding scheme to generate a third signal; and
 making a hard decision on the third signal to generate the information vector.

24. A method as defined in claim 23, wherein the updated information is generated by deinterleaving the remaining signal after subtracting the second signal from the third signal according to a deinterleaving pattern.

25. A method as defined in claim 17, further including receiving the signal.

26. An apparatus for receiving a signal provided in a communications system, comprising: a decoder for decoding a received signal according to a decoding scheme matching a zigzag B-LDPC (Block Low Density Parity Check) encoding scheme to generate an information vector.

27. An apparatus as defined in claim 26, wherein the zigzag B-LDPC encoding scheme is a scheme encoding the information vector corresponding to a parity check matrix including an information part corresponding to information bits and a parity part corresponding to parity bits, each of the information part and the parity part including a plurality of blocks each corresponding to a block matrix.

28. An apparatus as defined in claim 27, wherein the weight of each of the block rows constituting the information part is 1.

29. An apparatus as defined in claim 27, wherein the parity part comprises L sub-parity parts each having the same number of blocks, and the block matrix corresponding to a particular block belonging to each of the sub-parity parts is a matrix Z obtained by shifting the identity matrix toward left by one column so as to make all elements of the rightmost column have the value of zero, the matrix Z being expressed by the following mathematical Formula:

$$Z = \begin{pmatrix} 0 & 0 & 0 & \ldots & 0 \\ 1 & 0 & 0 & \ldots & 0 \\ 0 & 1 & 0 & \ldots & 0 \\ & & \vdots & & \\ 0 & \ldots & 0 & 1 & 0 \end{pmatrix}.$$

30. An apparatus as defined in claim 29, wherein if each of the L sub-parity parts includes L layers, and each of the L layers includes the same number of blocks, the particular block for each of the L sub-parity parts is an uppermost and rightmost one of the blocks included in an arbitrary one of the L layers.

31. An apparatus as defined in claim 30, wherein the weight of the layer containing the particular block only is not zero for each of the L sub-parity parts.

32. An apparatus as defined in claim 26, wherein the decoder comprises:
a first decoder for decoding the received signal and updated information in a previous decoding according to the decoding scheme matching the zigzag encoding scheme to generate a first signal;
a first subtracter for subtracting the updated information from the first signal;
an interleaver for interleaving an output signal of the first subtracter to generate a second signal;
a second decoder for decoding the second signal according to the decoding scheme matching the zigzag encoding scheme to generate a third signal; and
a hard decision unit for making a hard decision on the third signal to generate the information vector.

33. An apparatus as defined in claim 32, wherein the decoder further comprises:
a second subtracter for subtracting the second signal from the third signal; and
a deinterleaver for deinterleaving an output signal of the second subtracter according to a deinterleaving pattern to generate the updated information.

34. An apparatus as defined in claim 26, further including a receiver for receiving signals.

* * * * *